United States Patent [19]
Guichard et al.

[11] Patent Number: 5,767,672
[45] Date of Patent: Jun. 16, 1998

[54] INDUCTIVE PROXIMITY SENSOR FOR DETECTING MAGNETIC AND NON-MAGNETIC METALLIC OBJECTS

[75] Inventors: Christophe Guichard; Stéphane Even, both of Angouleme, France

[73] Assignee: Schneider Electric SA, Boulogne Billancourt, France

[21] Appl. No.: 711,658

[22] Filed: Sep. 9, 1996

[30] Foreign Application Priority Data

Sep. 8, 1995 [FR] France ................ 95-10642

[51] Int. Cl.[6] .............. G01V 3/10; H03K 17/95; H03B 1/00; G01R 33/12
[52] U.S. Cl. ............. 324/236; 324/207.26; 324/327; 331/65
[58] Field of Search ............... 324/327, 207.16, 324/207.26, 234, 236, 237; 331/65; 307/116, 117; 361/180; 340/941

[56] References Cited

U.S. PATENT DOCUMENTS

| | | | |
|---|---|---|---|
| 4,001,718 | 1/1977 | Wilson et al. | 324/236 X |
| 4,182,986 | 1/1980 | Parker | 324/236 |
| 4,879,512 | 11/1989 | Leonard et al. | 324/236 X |
| 5,043,679 | 8/1991 | Kriz et al. | 324/236 X |
| 5,278,523 | 1/1994 | Kriz | 324/236 X |
| 5,463,354 | 10/1995 | Calder et al. | 324/236 X |
| 5,519,317 | 5/1996 | Guichard et al. | 324/236 |

FOREIGN PATENT DOCUMENTS

| | | |
|---|---|---|
| 0 670 505 | 9/1995 | European Pat. Off. |
| 2 069 347 | 9/1971 | France |
| 2 074 878 | 10/1971 | France |

*Primary Examiner*—Gerard R. Strecker
*Attorney, Agent, or Firm*—Oblon, Spivak, McClelland, Maier & Neustadt, P.C.

[57] ABSTRACT

A universal inductive proximity detector including an oscillator, whose oscillating circuit is powered by a current source. A fixed frequency master oscillator 16, which controls the current source 18, is coupled to the oscillator 10 so that the current source excites the oscillating circuit with a pulsed direct current.

5 Claims, 2 Drawing Sheets

INDUCTIVE PROXIMITY SENSOR FOR DETECTING MAGNETIC AND NON-MAGNETIC METALLIC OBJECTS

This invention relates to a universal inductive proximity detector, that is to say one capable of detecting magnetic objects as well as non-magnetic objects, with a detection range that is approximately identical in both cases.

BACKGROUND OF THE INVENTION

Inductive proximity detectors generally include an analogue oscillator fitted with an LC oscillating circuit which has an equivalent loss resistance R and which is excited by a current source, the oscillator being arranged to translate the approach of a metal object into an analogue variation of a quantity characteristic of the oscillation, in particular, a variation of the amplitude of the oscillation resulting from the change in the equivalent loss resistance R.

The detection, at the same distance, of magnetic objects and non-magnetic objects has already been carried out or suggested many times.

In EP-393 359, an inductive proximity detector is described having an oscillating circuit powered by a direct current representative of the amplitude of oscillation supplied by a quartz oscillator. This detector requires a standardization of the impedance and the frequency peculiar to the oscillating circuit at the point of intersection of characteristic curves obtained respectively with a ferrous object and a non-ferrous object.

EP-399 563 reveals an inductive proximity detector capable of detecting magnetic objects and non-magnetic objects by using for this purpose two LC oscillating circuits, the coil of one capable of being affected by a magnetic object and the coil of the other not being affected.

On the other hand, it is also known (DE-33 20 509) to supply power to the oscillating circuit of an oscillator with coupled emitters by means of a direct current source controlled to the oscillator frequency. This device does not allow universal detection in the sense previously mentioned.

The aim of the invention is to allow detection by means of an inductive proximity detector, of magnetic objects and non-magnetic objects approximately at the same distance through simple measurements and at low cost.

SUMMARY OF THE INVENTION

According to the invention, the detector includes an analogue oscillator with an LC oscillating circuit and:

- a master oscillator supplying a fixed frequency wave and connected to a control input of the analogue oscillator current source,
- the analogue oscillator and master oscillator being tuned by frequency tuning means,
- the current source being controlled by the master oscillator to supply, in the presence and in the absence of an object an oscillating direct current with a frequency equal to the master wave frequency and in phase with it.

Preferably the oscillating current passing through the equivalent loss resistance of the oscillating circuit has a square wave shape, the width of the pulses varying in relation to the phase displacement of the oscillation of the analogue oscillator with respect to that of the master oscillator.

The analogue oscillator is advantageously of the coupled emitter type, the pulses of the oscillating current being supplied by the current source during the negative half-cycles of the analogue oscillation.

BRIEF DESCRIPTION OF THE DRAWINGS

One form of implementing the invention will now be described referring to the appended drawings.

DETAILED DESCRIPTION OF THE PREFERRED EMBODIMENT

Figure 1:
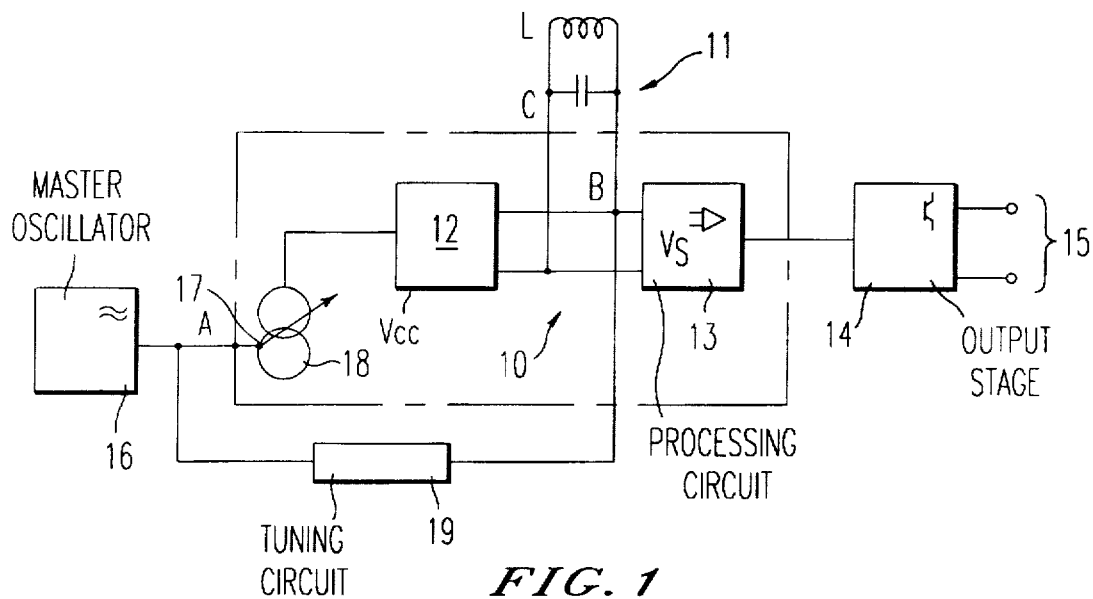
FIG. 1 is a block diagram of an inductive proximity detector conforming to the invention.

The inductive proximity detector illustrated in FIG. 1 is used to detect, indiscriminately and at the same range, magnetic and non-magnetic metallic objects. It includes an analogue oscillator 10 having on the one hand an oscillating circuit 11 made up of the assembly, in parallel, of a capacitance C and an inductance coil L which are influenced by the object to be detected, and on the other hand various active and passive elements shown at 12. The analogue oscillator nominally oscillates at the resonance frequency $\frac{1}{2\pi\sqrt{LC}}$ of the oscillating circuit and has the purpose of delivering, to a terminal B, a continuously maintained oscillation, the characteristics of which are modified when a metallic object come close to the coil.

The oscillation available at B is applied to a processing circuit 13 which includes, for example, a peak amplitude detector for the oscillation and a signal comparator that compares the peak amplitude detected with a threshold value $V_S$ representative of the detection range appropriate to the detector. The output signal from the comparator is passed to a control circuit of an output stage 14 connected via terminals 15 to an external charge and power supply circuit.

The proximity detector further includes a master oscillator 16 which supplies an oscillation of determined frequency which does not vary when the metallic object is closer or is further away. This oscillator can be of the quartz type. The oscillation available at the output A of the master oscillator 16, and, for example, divided in order to obtain the desired frequency level F, is applied to the control input 17 of a current source 18 which powers the oscillator 10 in order to excite its parallel resonant circuit 11. The current supplied to the LC circuit 11 from the current source is a pulsed current with an imposed frequency which is equal to the frequency appropriate to the oscillating circuit 11. A frequency tuning circuit 19 is provided to adjust the frequency appropriate to the LC circuit 11 in the absence of a metallic object to the frequency of the master oscillator 16 ; good tuning allows the precision of the detection to be increased. The coupling means described below ensure loose coupling of the analogue oscillator 10 with the master oscillator 16.

It is to be noted that the elements 12, 13 and 18 can be found included in integrated circuits commercially available.

Figure 2:
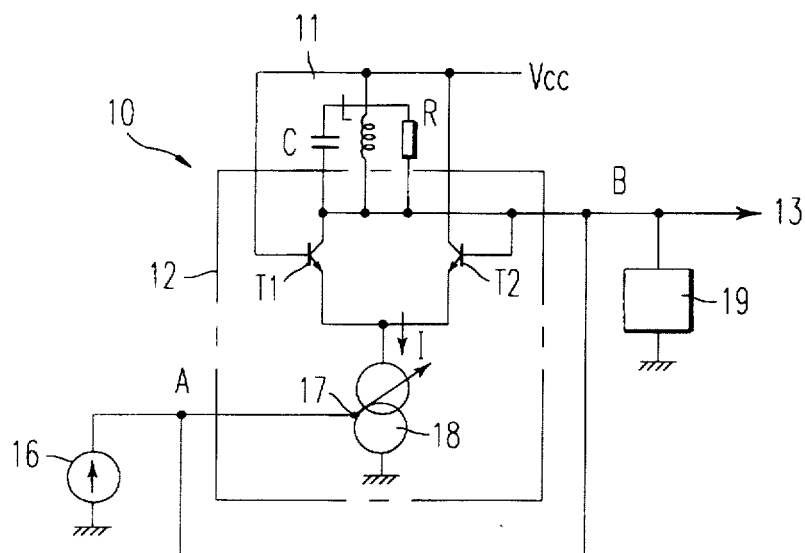
FIG. 2 shows an example of producing a part of the detector shown in FIG. 1.

In the embodiment of FIG. 2, the analogue oscillator 10 is of the emitter coupled type. It includes two bipolar transistors T1, T2 whose transmitters are interconnected and linked to a main terminal of the current source 18 whose other main terminal is earth. A polarisation voltage $V_{CC}$ generated internally or from the external charge and supply circuit is connected to the base of T1 and to the collector of T2; while the point B is connected on the one hand to the base of T2 and on the other hand to the collector of T1. The resonant circuit 11 is connected between $V_{CC}$ and the point B; the equivalent loss resistance of the circuit 11 has been represented by resistance R. At resonance, the current drained by the current source 18 is equal to the current passing through the loss resistance.

A coupling impedance Z, for example, comprising a resistance, links the points A and B in order to enlarge the capture range of the two oscillators 10 and 16.

Figure 3:
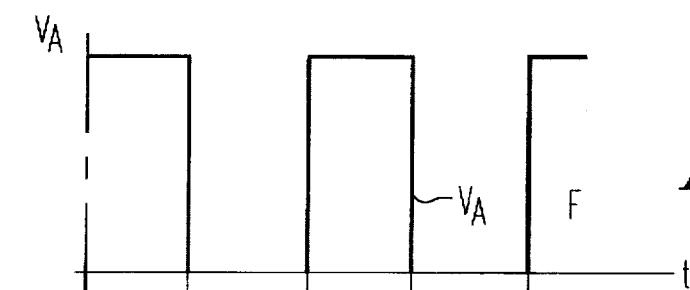
FIG. 3 shows the voltage supplied by the master oscillator
Figure 4A:
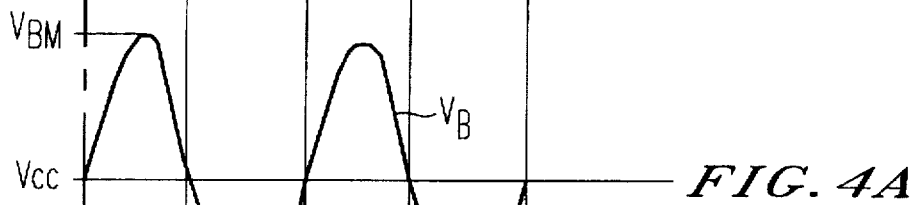
FIGS. 4A, 4B, 5A, 5B, 6A and 6B show the oscillation voltages and the excitation currents of the oscillating circuit for different states of operation of the detector.
Figure 4B:
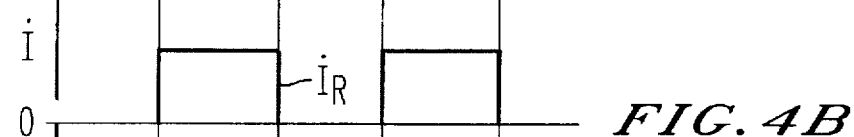

FIGS. 3 to 6B enable the operation of the inductive proximity detector conforming to the invention to be explained. FIG. 3 represents the oscillation supplied by the master oscillator 16 in the form of a square voltage wave $V_A$ of frequency F. In the absence of a metallic object, the pulses of current I of frequency F coming from the current source 18, the voltage of which is controlled by the master oscillator 16, are in phase with the negative half cycles of the voltage wave $V_A$ (see FIG. 4B). The oscillating circuit 11 generates an oscillation $V_B$ which is in phase with the master oscillation $V_A$ and whose value oscillates around $V_{CC}$ with an amplitude, at the most, equal to $V_{BE}$ of T1, T2 (see FIG. 4A).

Figure 5A:
Figure 5B:
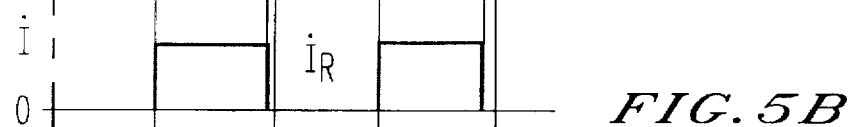
Figure 6A:
Figure 6B:
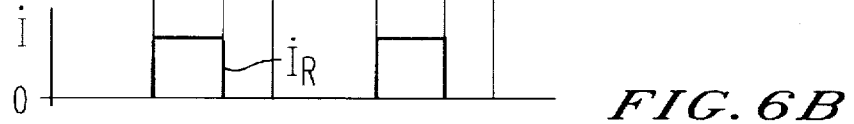

When a ferrous or magnetic metal object is close, the loss resistance of the oscillating circuit reduces, the oscillation $V_B$ is damped and its peak value reduces from the value $V_{BM}$ to the value $V_{BM1}$ (FIG. 5A). Since the frequency F was selected to be of the order of a few hundreds of kHz, the presence of the object only modifies the inductance L a little and the oscillation $V_B$ only undergoes a very small phase shift with respect to the master oscillation $V_A$. Hence, the current injected into the oscillating circuit stays approximately in phase with the voltage $V_B$ at its terminals (FIG. 5B).

When a non-ferrous or non-magnetic object is close, the loss resistance of the oscillating circuit only slightly reduces, whereas its inductance reduces greatly. The oscillation $V_B$ is therefore only slightly damped, but has a tendency to shift its phase to a significant extent, as is shown in the broken line in FIG. 6A, with respect to the master oscillation $V_A$. As the oscillator 10, for its part, only allows the injection of current I during the negative half cycles of the oscillation $V_B$, the result is that the square current pulses have their width drastically reduced in accordance with the size of the phase shift (see FIG. 6B) ; the rising edge of each pulse is synchronous with the descending edge of $V_A$, while the descending edge of the pulse is synchronous with the passing of $V_{CC}$ from $V_B$ to increasing values. The energy supplied by the current source to the oscillating circuit being, from then on, an analogue function of the approach of the non-magnetic object, the amplitude peak $V_{BM2}$ of the oscillation $V_B$ can be brought to a value close to the peak amplitude $V_{BM1}$ which would have been obtained with a magnetic object at the same range.

It should be noted that the analogue oscillator behaves so to speak, like a phase demodulator. The ranges of detection of magnetic and non-magnetic objects can be adjusted very precisely by slightly detuning the frequency of the LC circuit from the master oscillator frequency. The coupling obtained allows sufficient offset tolerance of the frequency of the analogue oscillator with respect to that of the master oscillator in a way that prevents their unhooking.

In practice, the inductive proximity detector described requires standardization consisting of tuning the frequency of the oscillating circuit 11 with the frequency F supplied by the master oscillator 16, using the adjusting means of the tuning circuit 19. It also requires a standardization, normal for proximity detectors, of the amplitude of the current exciting the analogue oscillator in a way that specifies the detection range as being the distance from the object for which the peak voltage $V_{BM}$ of the analogue oscillator is equal to the threshold value $V_S$ of the processing circuit.

Figure 7:
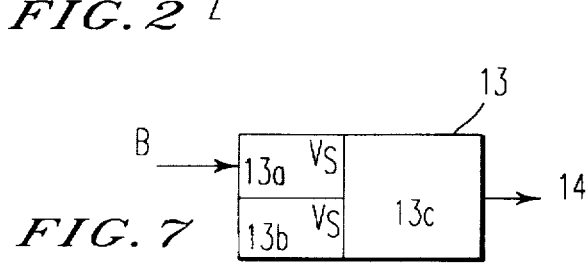
FIG. 7 illustrates a part of the detector in a selective detection application.

In a derived application, the universal detector can be adapted to selectively detect magnetic objects and non-magnetic objects if the frequency F is chosen to be less than a so-called critical frequency and if the processing circuit 13 includes a logic and electronic processing device suitable for the sizes of phase shift and amplitude reduction. This critical frequency can be defined as being the excitation frequency of the LC circuit for which the inductance of the coil stays practically constant when the distance of a magnetic object with respect to the detector is varied. In this case, (see FIG. 7), the processing circuit 13 can include an amplitude detector 13a and a phase detector 13b supplying respectively a damping signal and a phase shift signal when the amplitude and the phase shift of the oscillation $V_B$ reach respective thresholds $V_S$ and $\phi_S$; the processing circuit then also includes a discrimination logic 13c processing these respective signals in order to distinguish the magnetic or non-magnetic character of the object detected.

We claim:

1. An inductive proximity detector for the detection of magnetic and non-magnetic metallic objects including:

an analogue oscillator provided with an LC oscillating circuit and powered by a current source (18), the oscillator being arranged to translate the approach of an object into an analogue variation of a quantity characteristic of the oscillation, including its amplitude, a circuit for processing the oscillation amplitude, a master oscillator supplying a master wave of fixed frequency and coupled to the control input of the current source of the analogue oscillator, the analogue oscillator and the master oscillator being tuned to the same frequency, the current source supplying, in the presence and in the absence of an object, an oscillating current of frequency equal to the frequency of the master wave and in phase with it, the current injected into the oscillating circuit remaining approximately constant when a magnetic object approaches and being an analogue function of the approach of a non-magnetic object.

2. A detector according to claim 1, characterized by the fact that the oscillating current passing through the equivalent loss resistance of the oscillating circuit has a square wave shape with pulses of width that varies as a function of the phase shift of the oscillation of the analogue oscillator with respect to that of the master oscillator.

3. A detector according to claim 2, characterized by the fact that the analogue oscillator is of the coupled emitter type, the pulses of the oscillating current being supplied by the current source during the negative half cycles of the analogue oscillations.

4. A detector according to one of claims 1 to 3 characterized by the fact that the analogue oscillator and the master oscillator are connected through a predetermined coupling impedance in order to enlarge their capture range.

5. A detector according to claim 4, characterized by the fact that the frequency of the analogue oscillator is sub-critical and that the processing circuit includes an amplitude detector and a phase detector supplying respectively a damping signal and a phase shift signal when respectively the amplitude the phase shift of the analogue oscillator reach a respective threshold, and a discrimination logic which processes these signals in order to distinguish a magnetic object from a non-magnetic object.

* * * * *